United States Patent [19]

Debroux

[11] Patent Number: 5,376,900
[45] Date of Patent: Dec. 27, 1994

[54] PUSH-PULL OUTPUT STAGE FOR AMPLIFIER IN INTEGRATED CIRCUIT FORM

[75] Inventor: Jean-François Debroux, St Etienne de St Geoirs, France

[73] Assignee: Thomson-CSF Semiconducteurs Specifiques, Puteaux, France

[21] Appl. No.: 25,783

[22] Filed: Mar. 3, 1993

[30] Foreign Application Priority Data

Mar. 3, 1992 [FR] France .................. 92 02493

[51] Int. Cl.$^5$ .............................. H03F 3/26
[52] U.S. Cl. ..................... 330/271; 330/288
[58] Field of Search ............ 330/262, 271, 273, 274, 330/288

[56] References Cited

U.S. PATENT DOCUMENTS

| | | |
|---|---|---|
| 3,887,879 | 6/1975 | Radovsky . |
| 3,974,456 | 8/1976 | Russell et al. .................. 330/300 |
| 4,538,116 | 8/1985 | Vyne .................. 330/271 |
| 4,587,491 | 5/1986 | Koterasawa .................. 330/268 |
| 4,587,494 | 5/1986 | Widlar .................. 330/273 |
| 5,034,701 | 7/1991 | Debroux .................. 330/254 |

Primary Examiner—Steven Mottola
Attorney, Agent, or Firm—Oblon, Spivak, McClelland, Maier & Neustadt

[57] ABSTRACT

A push-pull output stage for electronic integrated circuits includes two NPN transistors (Q1, Q2) connected in series between two supply terminals. The output (S) is the junction point of the transistors. A third NPN transistor (Q3) has its base and its collector connected respectively to the base and to the collector of Q1. Two current flow arms (R1, Q4 and R2, Q5) are formed, one to establish a current depending on the potential of the emitter of Q3 and the other to establish a current depending on the potential of the emitter of Q1. The arms are mounted in a current mirror arrangement, the second arm tending to copy the current of the first arm; the current mirror generating a current output (S2) representing a difference between the current set up in the second arm and the current copied from the first arm. This current output is used to control the conduction of the second transistor (Q2). Thus, there is obtained an output stage using exclusively NPN transistors and having, at the same time, greater linearity than that of prior art devices.

3 Claims, 1 Drawing Sheet

PUSH-PULL OUTPUT STAGE FOR AMPLIFIER IN INTEGRATED CIRCUIT FORM

BACKGROUND OF THE INVENTION

1. Field of the Invention

The invention relates to an amplifier output stage designed to be made in integrated circuit form.

To supply high currents to a load, whether it be a resistive load, a capacitive load or a combined load, without working with a high rest current, push-pull output stages are most often used.

2. Description of the Prior Art

A push-pull stage comprises two main transistors placed in series between a positive supply terminal and a negative supply terminal. One of the transistors supplies the current during the positive half-waves and the other transistor supplies the current during the negative half-waves.

The junction point of the transistors constitutes the output of the stage. The load is connected between this output and a reference terminal which is at an intermediate potential between that of the two supply terminals.

In the most conventional type of push-pull stage (FIG. 1), the transistor T1 connected to the positive supply terminal is of the NPN type, and the other transistor, T2, is of the PNP type. The emitters are connected to the output S and the bases are connected to the input E. The rest current, namely the current that goes through the transistors when the output voltage is zero, may be low or even zero.

However, in monolithic integration techniques, it is preferred not to use any PNP transistors. They are bulky and low-speed elements. And it is also preferred not to use other technologies that mix, for example, bipolar transistors and field-effect transistors. Firstly, this considerably complicates the technology and, secondly, the performance characteristics of the stage will be unfavorably affected as far as speed is concerned, for field-effect transistors have capacitances that greatly slow down the electrical signals.

It has therefore been proposed to make push-pull type stages that use only NPN transistors. An example thereof is given is FIG. 2. This stage has two output transistors T1 and T2 capable of giving high currents to a load Z, these two transistors being in series between the positive and negative supply terminals, their junction point constituting the output S to which the load Z is connected. One of the transistors supplies the outgoing current flowing towards the load (positive half-waves), while the other transistor supplies the incoming current from the load (negative half-waves). A third transistor T3 controls the first two transistors: the bases of the first two transistors are respectively connected to the collector and to the emitter of the third transistor. The input E of the stage is the base of the third transistor: this third transistor is biased with an emitter resistance and a collector resistance.

This output stage is better suited to monolithic integration because it has only NPN transistors. Only one technology (NPN bipolar technology) is needed. It furthermore benefits from the speed of the NPN bipolar technology. However, it has poor linearity. It can hardly be used except as an auxiliary amplifier in a looped system (where the looping provides for the linearity). At the same time, when it is used in this way, it can be used only at fairly low frequencies, and the advantage that might be derived from the use of an entirely NPN technology is therefore lost.

SUMMARY OF THE INVENTION

The invention is aimed at overcoming the drawbacks of prior art circuits and, more specifically, at:

avoiding the use of transistors other than NPN transistors in the push-pull stage;

obtaining a speed of operation greater than that of known push-pull stages, whether these stages use solely NPN transistors or use a combination of different types of transistors.

To obtain these results, the present invention proposes a push-pull stage that comprises the following arrangements as described briefly: there are two main NPN transistors connected in series between the two supply terminals of the stage; the output is the common point between the emitter of the first transistor and the collector of the second transistor; a third NPN transistor has its base and its collector connected respectively to the base and to the collector of the first transistor; two current flow arms are formed, one connected to the emitter of the third transistor to set up a current depending on the potential of this emitter, and the other connected to the emitter of the first transistor, also to set up a current depending on the potential of this emitter, the two arms being furthermore mounted in a current mirror arrangement so that the second arm tends to copy the current in the first arm; the current mirror has a current output representing the difference between the current set up in the second arm and the current copied from the first arm; this current output is used to control the conduction of the second transistor.

If the details of the construction of the stage are examined more precisely, the push-pull type output stage according to the invention comprises, in series between a positive supply terminal and a negative supply terminal, an first NPN output transistor to supply a current to a load and a second NPN output transistor to receive a current coming from the load, the emitter of the first transistor and the collector of the second transistor being connected to a same node constituting the output of the stage, the stage further comprising a third NPN transistor having its base connected to the base of the first transistor and connected to an input of the stage, a first current flow arm connected between the emitter of the third transistor and the negative supply terminal to set up a current dependent on the potential at the emitter of the third transistor, and a second current flow arm connected between the emitter of the first transistor and the negative supply terminal to set up a current dependent on the potential at the emitter of the first transistor, the stage being one wherein the two arms are mounted as a current mirror, the second arm tending to copy the current in the first arm, this current mirror comprising a current output that outputs the difference between the current set up in the second arm and the current copied from the first arm, and provision being made for a means to control the conduction of the second transistor on the basis of the output current of the current mirror.

This arrangement yields an entirely NPN stage and, especially, a stage whose operations are carried out everywhere in terms of current and not in terms of voltage, so that there are far fewer limits in terms of operating speed. The parasitic capacitances have negligible influence. If, for example, insulated gate field effect transistors or any other system of voltage amplification of the potential difference between the first and third transistors were to be used, then the speed would be unfavorably affected by this fact.

Preferably, the two current flow arms each comprise a resistor in series with an NPN transistor that has its emitter connected to the negative supply terminal. The collector of this transistor, in the case of the first arm, is connected to its base either directly or by the base-emitter junction of an additional transistor. This additional transistor will generally be provided for, in general, when an amplifier transistor is interposed between the current output of the current mirror and the base of the NPN transistor.

BRIEF DESCRIPTION OF THE DRAWINGS

Other characteristics and advantages of the invention will appear from the following detailed description, made with reference to the appended drawings, of which.

MORE DETAILED DESCRIPTION

Figure 3:
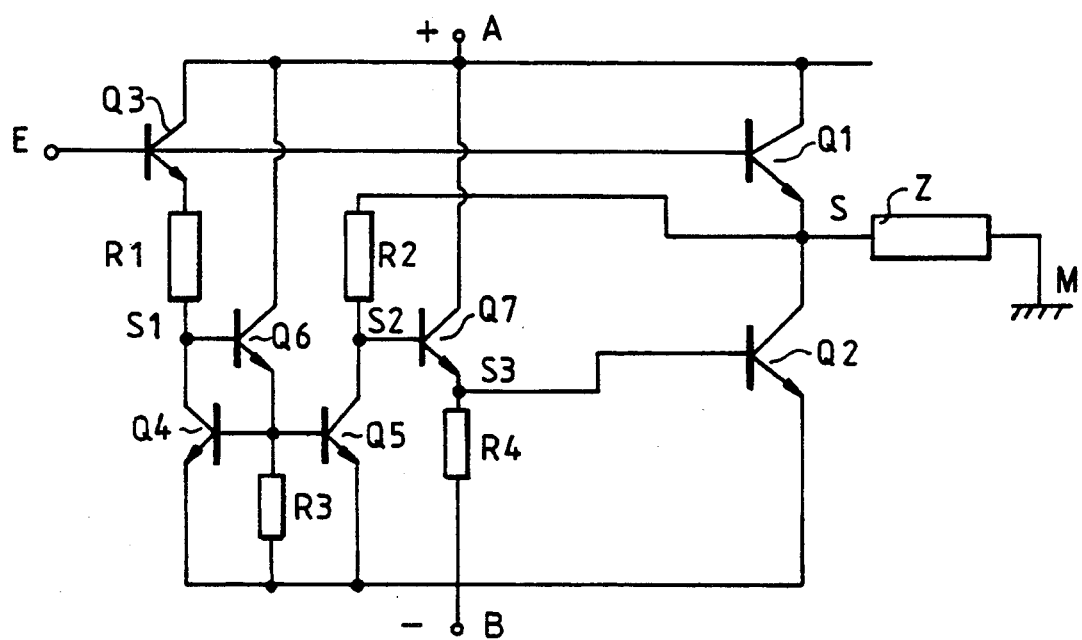
FIG. 3 shows a preferred drawing of a push-pull stage according to the present invention.

In FIG. 3, the references Q1 and Q2 designate the two main NPN transistors of the stage according to the invention, i.e. the transistor Q1 supplying current to the load Z (positive half-waves) and the transistor Q2 absorbing the current that comes from the load (negative half-waves). The transistor Q1 has its collector connected to a positive supply terminal A. The transistor Q2 has its emitter connected to a negative supply terminal B. The emitter of Q1 and the collector of Q2 are connected to an output S. A load Z is connected between the output S and a ground M to an intermediate potential between the potentials of the supply terminals A and B.

The stage comprises a third NPN transistor Q3 having its base connected to the base of the transistor Q1 and also connected to the input E of the stage, and having its collector connected, like that of Q1, to the positive terminal A.

The stage also has two current flow arms with a current mirror system.

The first arm is connected between the emitter of the transistor Q3 and the negative terminal B. It comprises chiefly a resistor R1 and a transistor Q4, and secondarily an additional transistor Q6. In this arm, there flows a current that is dictated by the value of the emitter potential of the transistor Q3, as shall be explained below. The resistor R1 is connected on one side to the emitter of Q3 and on the other side to a node S1 to which the collector of Q4 is connected. The emitter of Q4 is connected to the negative supply terminal B.

The second arm is connected between the emitter of the transistor Q1 and the negative supply terminal B. It comprises essentially a resistor R2 and a transistor Q5. The resistor R2 is connected on one side to the emitter of Q1 and on the other side to a node S2 also connected to the collector of Q5. The emitter of Q5 is connected to the terminal B. In the most convenient example, where the transistors Q4 and Q5 are identical, the resistors R1 and R2 are also identical.

To obtain a current mirror assembly, the bases of Q4 and Q5 are connected to each other and the emitters of Q4 and Q5 are also connected. The dimensions of the transistors Q4 and Q5 are identical in principle. If they were not identical, this fact would set up a current copying coefficient that would have to be taken into account. Furthermore, resistors with small values of resistance could be inserted between the emitters of these transistors and the terminal B, to define the value (unitary value or non-unitary value) of the copying coefficient.

Figure 1:
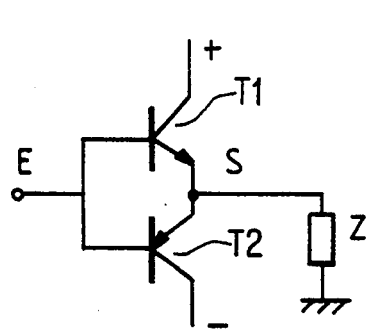
FIGS. 1 and 2, already described, show prior art push-pull stages.
Figure 2:
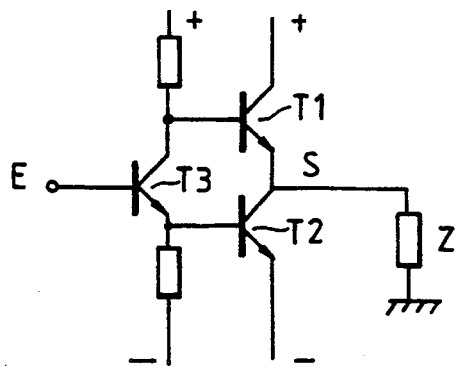

In the embodiment of FIG. 1, there is provision for a transistor Q6, the base-emitter junction of which is connected between the collector and the base of the transistor Q4. This transistor is there chiefly to set up a voltage drop of about 0.7 volts between the collector and the base of Q4, for reasons that shall be specified further below. A resistor R3 is connected between the emitter of Q6 and the negative supply terminal B to bias the transistor Q6.

The node S2, to which the collector of Q5 and the resistor R2 are connected, constitutes an output of the current mirror. At this output, there is tapped a current that is injected into the base of a transistor Q7. This current is the difference between the current that flows in the resistor R2 (dictated essentially as a function of the potential at the emitter of Q1), and the current that flows in the transistor Q5 (dictated by the copying of the current in Q4 which is itself dictated essentially by the potential at the emitter of Q3).

The transistor Q7 is mounted as a voltage follower stage. It has its emitter connected by a resistor R4 to the negative terminal B, and its collector connected to the positive terminal A. The transistors Q6 is preferably identical to the transistor Q7 and the resistors R3 and R4 are also identical so that, at equilibrium, the currents in Q6 and Q7 are equal.

Finally, the base of the transistor Q2 is connected to the output S3 of this follower stage, namely to the emitter of Q7.

It will be noted that the point S3 is at a potential of about 0.7 volts (drop in Q2 base-emitter voltage) with respect to the negative terminal B and that the potential of S2 is at a voltage of 0.7 volts above that of S3 (drop in Q7 base-emitter voltage). Similarly, the base potential of Q4 and Q5 is about 0.7 volts above that of the terminal B and, through the transistor Q6, the potential of the terminal S1 is about 1.4 volts above that of the terminal B.

Consequently, the potentials of S1 and S2 are very close to one other. If the transistors Q6 and Q7 have the same size and if the resistors R3 and R4 have the same values, this identity of potentials of S1 and S2 is met with even greater efficiency. If the transistors Q6 and Q7 have different sizes, the values of the resistors R3 and R4 will have the same ratio to one other as do the sizes of the transistors.

The operation of the stage is as follows: during the output positive half-waves of the potential Ve applied to the input E, the transistor Q1 undergoes the increases in the input potential Ve directly at its base. The potential Vs of the output S tends to follow these variations, with a voltage shift of about 0.7 volts: $Vs = Ve - 0.7$ volts. Q1 supplies the current to the load Z. Q2 is off. Simultaneously, the transistor Q3 supplies to its emitter a voltage that is very close to the voltage at the output S since it is also about 0.7 volts below the input voltage at E (drop in base-emitter voltage of Q3 of about 0.7 volts).

During the negative half-waves, the emitter voltage of Q1 follows, in principle, the diminishing of the input voltage Ve with the same shift of about 0.7 volts. However, if Ve falls too swiftly, or if the load is capacitive and tends to prevent the variations of Vs, there is a risk that the transistor Q1 may turn off, and the output potential will no longer follow the input potential linearly. We shall show how the present invention avoids this problem.

The voltage Vr1 at the terminals of R1 is about Ve−3×0.7 volts. In the transistor Q4, therefore, a current substantially proportional to this value Vr1 is set up. This current is copied out in Q5.

At the same time, the voltage Vr2 at the terminals of R2 is substantially equal to V−2×0.7 volts, i.e. normally Ve−3×0.7 volts. There is therefore set up, in R2, a current proportional to this value, hence in principle identical to the current copied out by Q5. However, if Vs does not remain equal to Ve−0.7 volts, then a difference in value will appear between the current copied by Q5 and the current generated in R2. This difference in current is absorbed in the base of the transistor Q7. In other words, the current mirror stage has a current output at S2, representing the current differences between the two arms, and this current output is directly applied as a current to be amplified by the transistor Q7.

The transistor Q7 greatly amplifies these current variations. The voltage tapped at the output S3 is then used directly as a base-emitter control voltage for the transistor Q2. This transistor Q2 can then swiftly be made more conductive to draw a current from the load Z, thus re-establishing the output voltage Vs at a value equal to Ve−0.7 volt. It must be noted that a very small disequilibrium of current in the current mirror will produce a high variation in voltage at the terminals of the resistor R4, and hence a very high variation in current in Q2 to discharge the current coming from the load.

It is seen that the biasing of the transistor Q6 corresponds to the biasing of the transistor Q7, i.e. when there is no disequilibrium, the Q6 base current is equal to the Q7 base current.

The choice of the value of R4 can be used to adjust the rest current flowing through the transistors Q1 and Q2 when there is a zero input voltage Ve.

It is possible to modify the scheme of FIG. 3, either by simplifying it or by making it more complex. In the case of FIG. 3, an intermediate transistor Q7 is used amplify the current of disequilibrium of the current mirror; and a transistor Q6 is then required to symmetrize the current mirror. It is possible to envisage the elimination of the transistors Q7 (and hence of Q6) by directly connecting the base of Q2 to the output S2. It is also possible to evisage intermediate stages of greater complexity between S2 and the base of Q2.

The invention can be used to obtain a push-pull output stage that is entirely formed by NPN transistors having a voltage gain lower than or equal to 1, which is a guarantee of stability when it is used in a looped circuit. Owing to the use of the NPN transistors and a feedback by the current mirror, the passband is high (it depends essentially on the cut-off frequency of the transistors Q2 and Q7). The rest current consumption may be low or zero, even if the output stage is built with transistors Q1 and Q2 enabling a high current supply. The linearity of the stage is very good. Finally, when the stage is made in integrated circuit form, it is less bulky than a stage that would use a PNP transistor. Indeed, the NPN transistor Q2, although large-sized, is far smaller than a PNP transistor capable of delivering the same current and, furthermore, the transistors and resistors of the current mirror may be very small.

What is claimed is:

1. A push-pull type output stage having only NPN bipolar transistors, comprising:
    a positive voltage supply terminal and a negative voltage supply terminal;
    a first NPN output transistor for supplying a current to a load;
    a second NPN output transistor for receiving a current supplied from said load, both an emitter of said first NPN output transistor and a collector said second NPN output transistor being connected to a single node constituting an output terminal of said push-pull type output stage;
    a third NPN transistor, a base thereof being connected to a base of said first NPN output transistor and to an input terminal of said push-pull type output stage;
    a first current flow arm, comprising a series arrangement of a first resistor and a fourth NPN transistor, said first resistor having one terminal thereof connected to an emitter of said third NPN transistor and another terminal thereof connected to a collector of said fourth NPN transistor, said fourth NPN transistor having an emitter thereof connected to said negative voltage supply terminal to thereby establish a first current flowing through said fourth NPN transistor in accordance with a potential at said emitter of said third NPN transistor;
    a second current flow arm, comprising a series arrangement of a second resistor and a fifth NPN transistor, said second resistor having one terminal thereof connected to said emitter of said first NPN output transistor and another terminal thereof connected to a collector of said fifth NPN transistor, said fifth NPN transistor having an emitter thereof connected to said negative voltage supply terminal to thereby establish a second current flowing through said second resistor in accordance with a potential at said emitter of said third NPN transistor, wherein said first NPN output transistor and said second NPN output transistor are connected in series between said positive voltage supply terminal and said negative voltage supply terminal, and wherein said fourth and fifth NPN transistors are connected so as to form a current mirror such that a current flowing in said fifth NPN transistor is a copy of a current flowing in said fourth NPN transistor, said current mirror generating a current output and delivering said current output to a current output node, said current output representing a difference between said current established in said second resistor and said current flowing in said fifth NPN transistor; and
    means for controlling a conduction of said second NPN output transistor in accordance with said current output of said current mirror.

2. A push-pull type output stage according to claim 1, wherein a base of said fourth NPN transistor is connected to said collector thereof.

3. A push-pull type output stage according to claim 1, wherein said means for controlling said conduction of said second NPN output transistor comprises a voltage follower transistor interposed between said current output node and a base of said second NPN output transistor, and wherein a sixth NPN transistor having a base-emitter junction thereof connected between a collector and a base of said fourth NPN transistor is provided.

* * * * *